United States Patent
Yao et al.

(10) Patent No.: US 10,622,926 B1
(45) Date of Patent: Apr. 14, 2020

(54) CONTROLLER OF DC BRUSHLESS MOTOR AND CONTROL METHOD THEREOF

(71) Applicant: JYEN HERR ENTERPRISE CO., LTD., Changhua (TW)

(72) Inventors: Kevin Yao, Changhua (TW); Chien-Wei Lai, Changhua (TW)

(73) Assignee: JYEN HERR ENTERPRISE CO., LTD., Changhua (TW)

(*) Notice: Subject to any disclaimer, the term of this patent is extended or adjusted under 35 U.S.C. 154(b) by 0 days.

(21) Appl. No.: 16/265,741

(22) Filed: Feb. 1, 2019

(51) Int. Cl.
  *H02P 6/14* (2016.01)
  *H02P 23/00* (2016.01)
  *H03K 5/24* (2006.01)
  *H02P 25/03* (2016.01)

(52) U.S. Cl.
  CPC .............. *H02P 23/00* (2013.01); *H02P 25/03* (2016.02); *H03K 5/24* (2013.01)

(58) Field of Classification Search
  CPC .................................. H02P 23/00; H02P 25/03
  USPC ..................................................... 318/400.26
  See application file for complete search history.

(56) References Cited

U.S. PATENT DOCUMENTS

| | | | | |
|---|---|---|---|---|
| 5,194,787 A | * | 3/1993 | Antognini | H02P 6/182 318/400.06 |
| 5,694,010 A | * | 12/1997 | Oomura | H02P 6/34 318/400.07 |
| 6,201,929 B1 | * | 3/2001 | Yu | H02P 7/288 318/268 |
| 2014/0361724 A1 | * | 12/2014 | Rogers | H02P 27/08 318/807 |

FOREIGN PATENT DOCUMENTS

TW   I290415 B   11/2007

OTHER PUBLICATIONS

English Abstract for TWI290415, Total of 1 page.

\* cited by examiner

*Primary Examiner* — Erick D Glass
(74) *Attorney, Agent, or Firm* — Tracy Heims; Apex Juris, pllc.

(57) ABSTRACT

A controller of a DC brushless motor and a control method thereof are disclosed. The controller is connected to a commutation circuit including three voltage dividers and three comparators. Each voltage divider includes a first resistor and a second resistor connected in series. Each first resistor is connected to a terminal voltage of three-phase coils of the DC brushless motor. Each comparator includes a positive input end connected to a node connected to the first resistor and the second resistor of the corresponding voltage divider and a negative input end connected to the node of the adjacent voltage divider. The controller includes a control circuit and three bias resistors respectively connected to a voltage source and the node of the corresponding voltage divider. The control circuit detects a counter EMF signal of each phase coil and controls the voltage source to supply an offset voltage to the corresponding node.

16 Claims, 9 Drawing Sheets

CONTROLLER OF DC BRUSHLESS MOTOR AND CONTROL METHOD THEREOF

BACKGROUND OF THE INVENTION

Technical Field

The present invention is related to a brushless motor controlling technology, and more particularly to a controller of a DC brushless motor and a control method thereof, which could improve a problem of backward phase when using a DC brushless motor commutation circuit.

Description of Related Art

Non-sensing driving technology currently applied to a commutation circuit of a brushless motor includes a counter EMF zero-crossing estimation method and a terminal voltage comparison estimation method, etc.

The counter EMF zero-crossing estimation method compares a sensed terminal voltage of a non-conducting phase coil with a virtual neutral voltage to obtain a zero-crossing point of the counter EMF. However, predicting a correct commutation point is related to the motor characteristics. Therefore, it is hard to control when driving motors with various parameters.

The terminal voltage comparison estimation method compares a terminal voltage of three-phase coils with a variation of a counter EMF to obtain a commutation signal of the three-phase coils. For instance, as disclosed in the Taiwan patent number 1290415, titled "Sensorless commutation circuit and three-phase commutation signal detection method for three-phase brushless DC motor", using the terminal voltage comparison estimation method to obtain a lagging counter EMF zero-crossing 30 degrees pulse wave signal as a commutation signal for detecting the actual rotation of the brushless motor. The driving technology of the terminal voltage comparison estimation method does not require the relevant characteristic parameters of the motor, so that it can be widely applied to various types of motors with different driving parameters. However, the counter EMF of a commutation point of the terminal voltage comparison estimation method needs to be filtered, which is easy to cause the commutation time delay to generate a surge current, affecting the electromagnetic compatibility (EMC) and the motor output efficiency. Therefore, there is a need for the manufacturers to improve the phase lagging problem when using the motor control technology of the terminal voltage comparison estimation method.

BRIEF SUMMARY OF THE INVENTION

In view of the above, the purpose of the present invention is to provide a controller of a direct-current (DC) brushless motor and a control method thereof, which could effectively improve a phase backward problem to achieve phase synchronization.

The present invention provides a controller for a DC brushless motor, wherein the controller is adapted to be connected to a commutation circuit. The commutation circuit includes three voltage dividers and three comparators. Each of the voltage dividers includes a first resistor and a second resistor which are connected in series. An end of each of the first resistors is connected to a corresponding terminal voltage of three-phase coils of the DC brushless motor. Each of the comparators includes a positive input end and a negative input end. The positive input end of each of the comparators is connected to a node connected to the first resistor and the second resistor of the corresponding voltage divider. The negative input end of each of the comparators is connected to the node of the adjacent voltage divider. The controller includes three bias resistors and a control circuit. Each of the bias resistors has an input end and an output end, wherein each of the input ends is connected to a voltage source. Each of the output ends is connected to the node of one of the voltage dividers. The control circuit electrically connected to the three-phase coils, wherein the control circuit is configured to detect a counter EMF signal of each of the three-phase coils and to supply an electric energy based on a detecting result, thereby to provide an offset voltage to the node of the corresponding voltage divider via the corresponding bias resistor.

The present invention provides a control method for a DC brushless motor, wherein the DC brushless motor is connected to a commutation circuit. The commutation circuit includes three voltage dividers and three comparators. Each of the voltage dividers includes a first resistor and a second resistor which are connected in series. An end of each of the first resistors is connected to a corresponding terminal voltage of three-phase coils of the DC brushless motor; each of the comparators includes a positive input end and a negative input end. The positive input end of each of the comparators is connected to a node connected to the first resistor and the second resistor of the corresponding voltage divider. The negative input end of each of the comparators is connected to the node of the adjacent voltage divider. The control method includes steps of supply electricity to the DC brushless motor to drive the DC brushless motor to operate; detect a counter EMF signal of each of the three-phase coils, and provide an offset voltage to the node of the corresponding voltage divider based on a detecting result.

The advantage of the present invention is that by detecting the counter EMF signal of each of the phase coils and supplying the offset voltage to the node of the corresponding voltage divider at an appropriate timing, the phase lagging problem and the phase delaying problem could be effectively compensated, providing a performance of compulsory early commutation, achieving the early commutation control.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
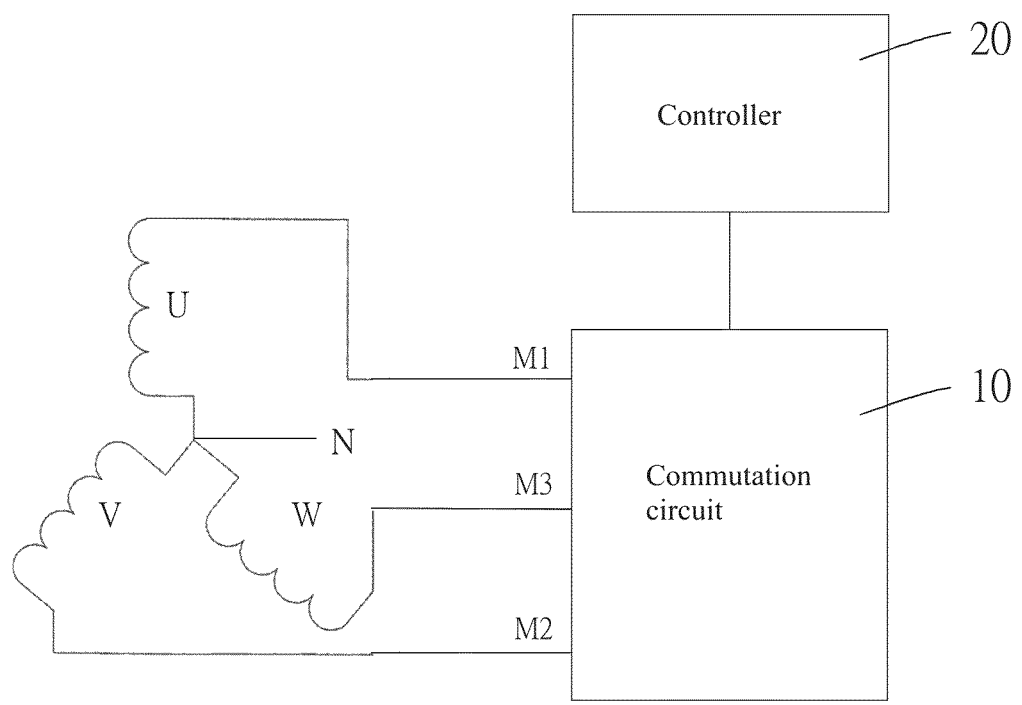
FIG. 1 is a schematic diagram, showing the controller, the three-phase coils of the DC brushless motor, and the commutation circuit according to an embodiment of the present invention.
Figure 2:
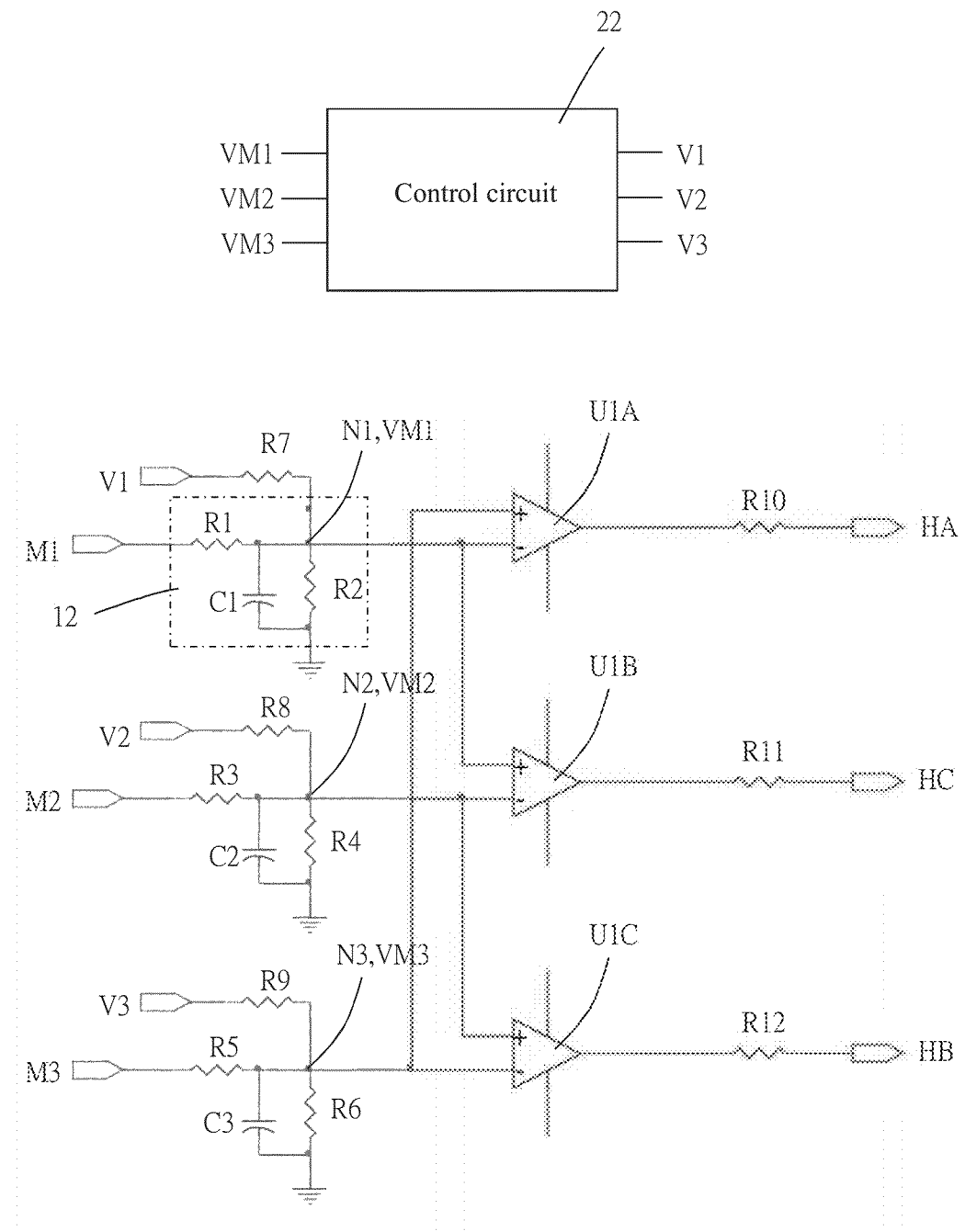
FIG. 2 is a circuit diagram of the controller and the commutation circuit according to the embodiment of the present invention.

Three-phase coils U, V, W, a commutation circuit 10, and a controller 20 of a direct-current (DC) brushless motor according to an embodiment of the present invention are illustrated in FIG. 1 and FIG. 2. In the current embodiment, the three-phase coils U, V, W are arranged in star (Y). However, the arrangement of the three-phase coils U, V, W is not a limitation of the present invention. In other embodiments, the three-phase coils U, V, W could be arranged in delta (Δ).

An operational phase sequence of the three-phase coils U, V, W is usually controlled by a driver. For example, the driver could be but not limited to a switch member such as a plurality of MOSFETs or a plurality of IGBTs. In an embodiment, the driver could be achieved by dividing six MOSFETs into three upside switches and three lowside switches, and could sequentially drive each of the three-phase coils U, V, W to drive the DC brushless motor to operate by controlling on and off of the upside switches and the lowside switches.

The commutation circuit 10 includes three voltage dividers 12 (i.e., a first voltage divider, a second voltage divider, and a third voltage divider) and three comparators U1A, U1B, U1C (i.e., a first comparator U1A, a second comparator U1B, and a third comparator U1C), wherein each of the voltage dividers 12 includes a first resistor R1, R3, R5 and a second resistor R2, R4, R6 which are connected in series. An end of each of the first resistors R1, R3, R5 is connected to one corresponding terminal voltage M1, M2, M3 of the three-phase coils U, V, W of the DC brushless motor. A junction between each of the first resistors R1, R3, R5 and the corresponding second resistor R2, R4, R6 is defined as a node N1, N2, N3. Each of the comparators U1A, U1B, U1C includes a positive input end and a negative input end, wherein the positive input end of each of the comparators U1A, U1B, U1C is connected to the node N1, N2, N3 of the corresponding voltage divider 12, and the negative input end is connected to the node N1, N2, N3 of the adjacent voltage divider 12. Said adjacent voltage divider 12 is different from said corresponding voltage divider 12. More specifically, in the current embodiment, the node N1 of the first voltage divider is connected to the negative input end of the first comparator U1A and the positive input end of the second comparator U1B; the node N2 of the second voltage divider is connected to the negative input end of the second comparator U1B and the positive input end of the third comparator U1C; the node N3 of the third voltage divider is connected to the negative input end of the third comparator U1C and the positive input end of the first comparator U1A. In an embodiment, each of the voltage dividers 12 could further provide with a filter capacitor C1, C2, C3, thereby to form an RC filter.

Figure 3:
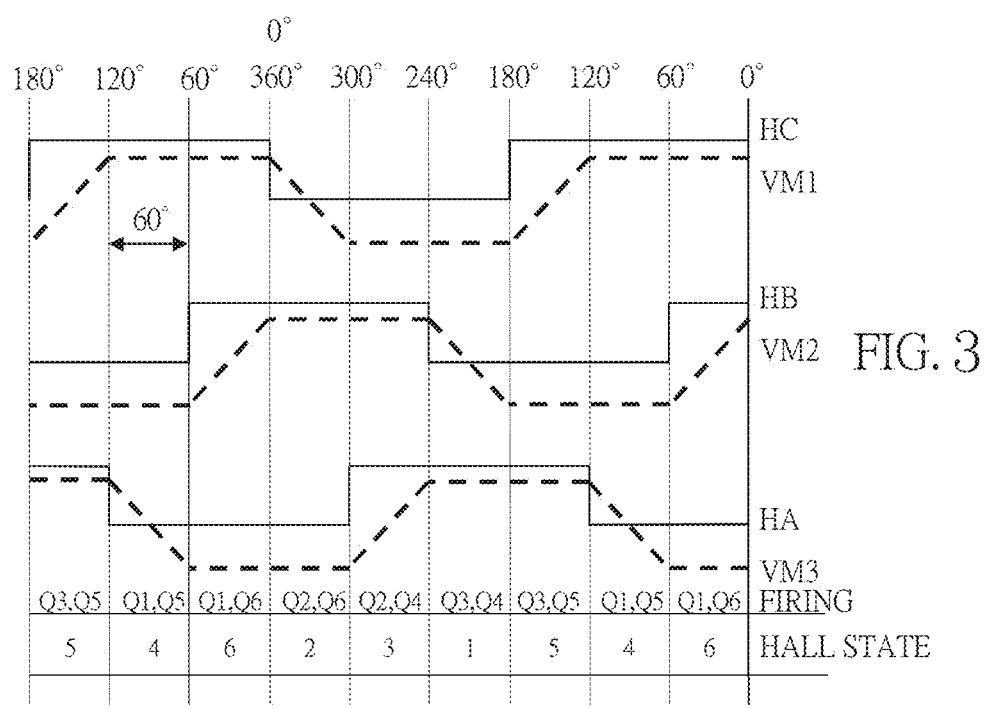
FIG. 3 is a timing schematic diagram of the counter EMF signals and the logic signals.

With the aforementioned design of the commutation circuit 10, each of the comparators U1A, U1B, U1C could obtain a counter electromotive force signal VM1, VM2, VM3 (counter EMF signal) of each two adjacent phase coils of the three-phase coil U, V, W, wherein each of said counter EMF signals VM1, VM2, VM3 has been voltage divided. Each of the comparators U1A, U1B, U1C performs a comparison operation on the corresponding counter EMF signal VM1, VM2, VM3 to estimate a corresponding commutation logic signal. For instance, as shown in FIG. 2, FIG. 3, and table 1, in an embodiment, an excitation timing and a commutation sequence of the three-phase coils U, V, W could be controlled by controlling on and off of the upside switches Q1, Q3, Q5 and the lowside switches Q2, Q4, Q6. Logic signals HC, HB, HA with a lagging counter EMF zero-crossing 30 degrees electrical angle could be obtained after the comparators U1A, U1B, U1C performs a comparison operation on the counter EMF signals VM1, VM2, VM3 of the phase coils. The phase difference between each of the logic signals HC, HB, HA is 60 degrees. Since both of the logic signals HC, HB, HA and commutation signals detected by a Hall detector are with a lagging 30 degrees phase difference, the logic signals HC, HB, HA could be used as the commutation signals, and could be divided into six conduction phase sequence angle intervals, which are 0 to 60 degrees, 60 degrees to 120 degrees, 120 degrees to 180 degrees, 180 degrees to 240 degrees, 240 degrees to 300 degrees, 300 degrees to 360 degrees, wherein each of the phase sequences corresponds to a Hall state S1-S6.

TABLE 1

| Hall state S1 | HALL STATE: Bin = 110:6 | |
|---|---|---|
| VM1 > VM2, HC = 1 | VM2 > VM3, HB = 1 | VM3 < VM1, HA = 0 |
| Hall state S2 | HALL STATE: Bin = 100:4 | |
| VM1 > VM2, HC = 1 | VM2 < VM3, HB = 0 | VM3 < VM1, HA = 0 |
| Hall state S3 | HALL STATE: Bin = 101:5 | |
| VM1 > VM2, HC = 1 | VM2 < VM3, HB = 0 | VM3 > VM1, HA = 1 |
| Hall state S4 | HALL STATE: Bin = 001:1 | |
| VM1 < VM2, HC = 0 | VM2 < VM3, HB = 0 | VM3 > VM1, HA = 1 |
| Hall state S5 | HALL STATE: Bin = 011:3 | |
| VM1 < VM2, HC = 0 | VM2 > VM3, HB = 1 | VM3 > VM1, HA = 1 |
| Hall state S6 | HALL STATE: Bin = 010:2 | |
| VM1 < VM2, HC = 0 | VM2 > VM3, HB = 1 | VM3 < VM1, HA = 0 |

In practice, when sampling the counter EMF signals, usually accompanied by noise, which is easy to cause a misjudgment of the commutation signals. The counter EMF passes through the components such as voltage dividers, comparators, and etc., and is affected by the operation time of the components such as comparators, so that a commutation time is delayed and lagged, resulting in a time lag between the estimated commutation signal and the actual commutation demand point. As a result, it is easily to generate a surge current when commutating, which may not only cause a tremble when a motor is in operation and cause a low output efficiency of the motor, but also affect an electromagnetic compatibility.

As shown in FIG. 2, the controller 20 includes three bias resistors R7, R8, R9 and a control circuit 22, wherein each of the bias resistors R7, R8, R9 has an input end and an output end. Each of the input ends is connected to a voltage source V1, V2, V3. Each of the output ends is connected to the node N1, N2, N3 of one of the voltage dividers 12. The control circuit 22 is electrically connected to the three-phase coils U, V, W, and is adapted to detect the counter EMF signals VM1, VM2, VM3 of the three-phase coils U, V, W, and controls the voltage sources V1, V2, V3 to supply an electric energy based on a detecting result, thereby to supply an offset voltage to the node N1, N2, N3 of the corresponding voltage divider 12 via the corresponding bias resistor R7, R8, R9.

With the aforementioned design, a control method using the controller and including the following steps could be executed. First, supply electricity to the DC brushless motor, so that the DC brushless motor operates to generate the counter EMF signals. For instance, in an embodiment, one of the phase coils is excited first, and the next phase coil is sequentially excited, thereby to achieve a brushless motor start-up procedure. Then, the control circuit 22 detects the counter EMF signal of each of the phase coils, thereby to determine the commutation sequence (commutation order) of the phase coils U, V, W accordingly. In this way, the control circuit 22 could detect or predict a control logical sequence of the phase sequence when the motor is running, and could supply the offset voltage to the node N1, N2, N3 of the corresponding voltage divider 12 based on the detecting result, thereby to change the counter EMF signals VM1, VM2, VM3 on the nodes N1, N2, N3, so that the comparators U1A, U1B, U1C could perform a comparison operation on the counter EMF signals VM1, VM2, VM3 in advance so as to output the commutation logic signal earlier, providing a performance of compulsory early commutation, so that the phase could not lagging, or the phase could even be ahead.

Figure 4:
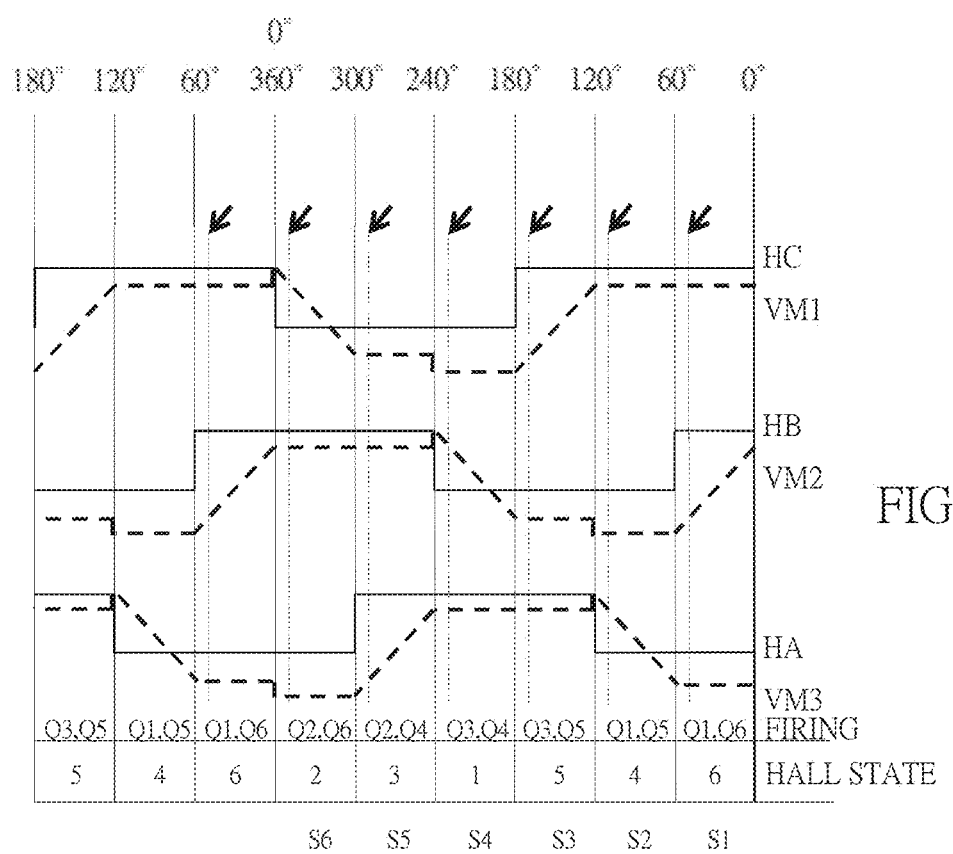
FIG. 4 is a timing schematic diagram of the counter EMF signals and the logic signals, showing the control circuit could detect or predict the control logical sequence of the phase sequence when the motor is running, and could timely supply a positive offset voltage to the node of the voltage divider which corresponds to the phase coil of the next phase sequence after completing the logical sequence control of the previous phase sequence.

For instance, in an embodiment as shown in FIG. 2 to FIG. 4, the control circuit 22 could detect or predict the control logical sequence of the phase sequence when the motor is running, and could timely supply a positive offset voltage to the node N1, N2, N3 of the voltage divider 12 which corresponds to the phase coil of the next phase sequence after completing the logical sequence control of the previous phase sequence. For example, in the interval of 120 degrees to 240 degrees, after completing the control of the logic signals of the previous phase sequence (i.e., the interval of 60 degrees to 120 degrees), the control circuit 22 timely controls the corresponding voltage source V2 to output electricity, thereby to output a positive offset voltage to the corresponding node N2 of the voltage divider 12 which corresponds to the phase coil V via the corresponding bias resistor R8. In this way, as shown in FIG. 4, the corresponding counter EMF signal VM2 of the node N2 could rise a predetermined value in the interval of 120 degrees to 240 degrees. Hence, in the interval of 120 degrees to 180 degrees, when the comparator U1B compares the counter EMF signal VM1 of the node N1 and the counter EMF signal VM2 of the node N2, the logic signal HC could be converted in advance to achieve the early commutation effect. In addition, in the interval of 180 degrees to 240 degrees, when the comparator U1C compares the counter EMF signal VM2 of the node N2 and the counter EMF signal VM3 of the node N3, the logic signal HB could be converted in advance to achieve the early commutation effect.

Moreover, in the interval of 240 degrees to 360 degrees, after completing the control of the logic signals of the previous phase sequence (i.e., the interval of 180 degrees to 240 degrees), the control circuit 22 timely controls the corresponding voltage source V1 to output electricity, thereby to output a positive offset voltage to the corresponding node N1 of the voltage divider 12 which corresponds to the phase coil U via the corresponding bias resistor R7. In this way, as shown in FIG. 4, the corresponding counter EMF signal VM1 of the node N1 could rise a predetermined value in the interval of 240 degrees to 360 degrees. Whereby, in the interval of 240 degrees to 300 degrees, when the comparator U1A compares the counter EMF signal VM3 of the node N3 and the counter EMF signal VM1 of the node N1, the logic signal HA could be converted in advance to achieve the early commutation effect. Also, in the interval of 300 degrees to 360 degrees, when the comparator U1B compares the counter EMF signal VM1 of the node N1 and the counter EMF signal VM2 of the node N2, the logic signal HC could be converted in advance to achieve the early commutation effect.

Furthermore, in the interval of 0 degree to 60 degrees, after completing the control of the logic signals of the previous phase sequence (i.e., the interval of 300 degrees to 360 degrees), the control circuit 22 timely controls the corresponding voltage source V3 to output electricity, thereby to output a positive offset voltage to the corresponding node N3 of the voltage divider 12 which corresponds to the phase coil V via the corresponding bias resistor R9. In this way, as shown in FIG. 4, the corresponding counter EMF signal VM3 of the node N3 could rise a predetermined value in the interval of 0 degrees to 120 degrees. Whereby, in the interval of 0 degrees to 60 degrees, when the comparator U1C compares the counter EMF signal VM3 of the node N3 and the counter EMF signal VM2 of the node N2, the logic signal HB could be converted in advance to achieve the early commutation effect. Also, in the interval of 60 degrees to 120 degrees, when the comparator U1A compares the counter EMF signal VM3 of the node N3 and the counter EMF signal VM1 of the node N1, the logic signal HA could be converted in advance to achieve the early commutation effect.

In this way, the logic signals HC, HB, HA shown in FIG. 4 would be ahead of the logic signals HC, HB, HA shown in FIG. 3. For instance, the phase advances to the vertical dotted line at where the arrow points in FIG. 4, thereby to improve the phase lagging problem to achieve the early commutation effect.

In addition, the value of the supplied offset voltage could be controlled by the control circuit 22 according to a downward inclination, a voltage value, a phase current value, or a motor rotational speed of the counter EMF signal detected by the control circuit 22. For instance, the supplied offset voltage could be increased for achieving the early commutation control.

Moreover, in an embodiment, the control circuit 22 could determine to supply the offset voltage to which nodes N1, N2, N3 by providing a positive offset voltage to the node of the voltage divider 12 which corresponds to the phase coil of the next phase sequence when detecting the counter EMF signal of one of the phase coils rises to a predetermined threshold value. For instance, referring to FIG. 3 and FIG. 4, in the interval of 60 degrees to 120 degrees, when the detected counter EMF signal VM3 rises to the predetermined threshold value or exceeds the predetermined threshold value, a positive offset voltage is supplied to the node N2 of the voltage divider 12 which corresponds to the phase coil V of the next phase sequence, so that a level of the counter EMF signal VM2 of the node N2 rises. In the interval of 180 degrees to 240 degrees, when the detected counter EMF signal VM2 rises to the predetermined threshold value or exceeds the predetermined threshold value, a positive offset voltage is supplied to the node N1 of the voltage divider 12 which corresponds to the phase coil U of the next phase sequence, so that a level of the counter EMF signal VM1 of the node N1 rises. In the interval of 300 degrees to 360 degrees, when the detected counter EMF signal VM1 rises to the predetermined threshold value or exceeds the predetermined threshold value, a positive offset voltage is supplied to the node N3 of the voltage divider 12 which corresponds to the phase coil W of the next phase sequence, so that a level of the counter EMF signal VM3 of the node N3 rises. In this way, the phase lagging problem could be improved, and the early commutation effect could be achieved.

However, a length of the interval of the compensating offset voltage is not limited to be 120 degrees. In an embodiment, the control circuit 22 detects or predicts the control logical sequence of the phase sequence when the motor is running so as to predict an occurrence time or position of the next commutation point accordingly, and supplies an offset voltage to the node of the corresponding voltage divider when approaching the commutation point or within a short interval close to the commutation point, and then removes the offset voltage after the commutation is completed, wherein the short interval could be but not limited to 2 degrees, 5 degrees, 10 degrees, 15 degrees, or etc. For example, when approaching the commutation point, a positive offset voltage in the form of a pulse wave (pulse) could be provided to convert the corresponding logic signal in advance, thereby to achieve the early commutation effect.

In addition, in an embodiment, the control circuit of the controller could output an offset voltage via each of the bias resistors according to a predetermined sequence based on a predetermined program set in advance. For example, sequentially outputting an offset voltage according to an order of the bias resistor R7, the bias resistor R8, and the bias resistor R9. While using such controller, the user has to connect the output end of each of the bias resistors to the node of the corresponding voltage divider according to the commutation sequence of the phase coils. For instance, if the predetermined program outputs the offset voltage according to the order of the bias resistor R7, the bias resistor R8, and the bias resistor R9, and the commutation sequence of the three-phase coils U, V, W of the DC brushless motor is in an order of the phase coil U, the phase coil V, and the phase coil W, the user has to connect the output end of the bias resistor R7 to the node N1 of the voltage divider corresponding to the phase coil U, and connect the output end of the bias resistor R8 to the node N2 of the voltage divider corresponding to the phase coil V, and then connect the output end of the bias resistor R9 to the node N3 of the voltage divider corresponding to the phase coil W. In this way, the controller could supply the offset voltage to the voltage divider corresponding to each of the phase coils according to the predetermined sequence.

Figure 5:
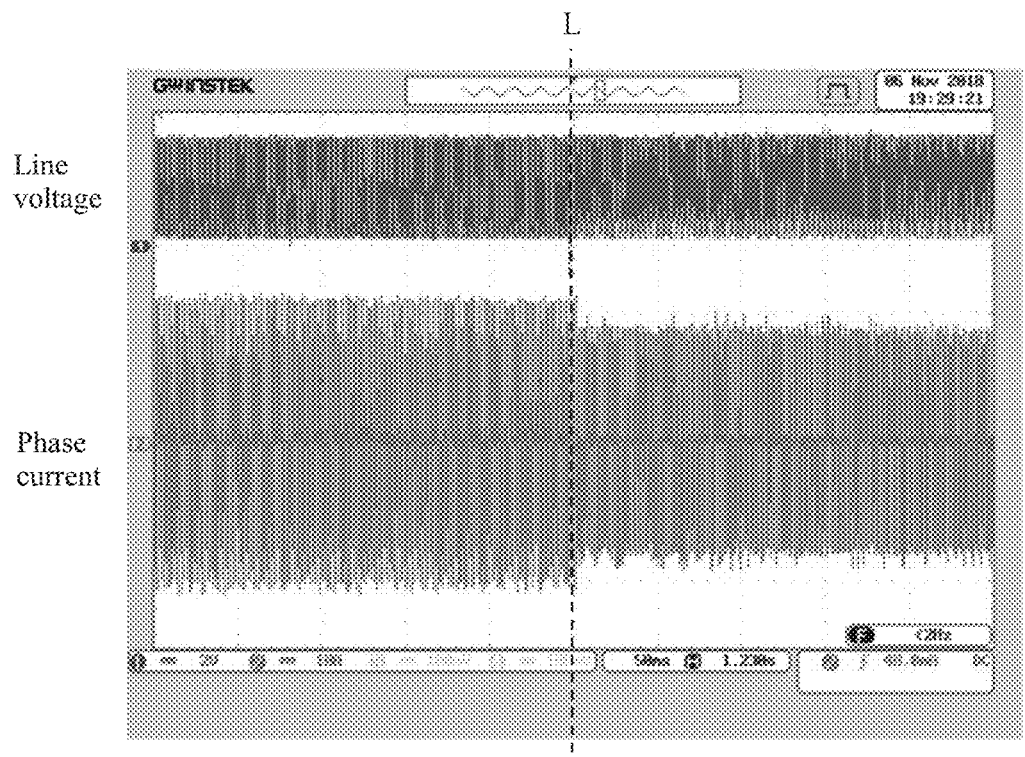
FIG. 5 is an oscillogram of the line voltage and the phase current, showing the waveform difference before and after the compensated offset voltage.
Figure 6:
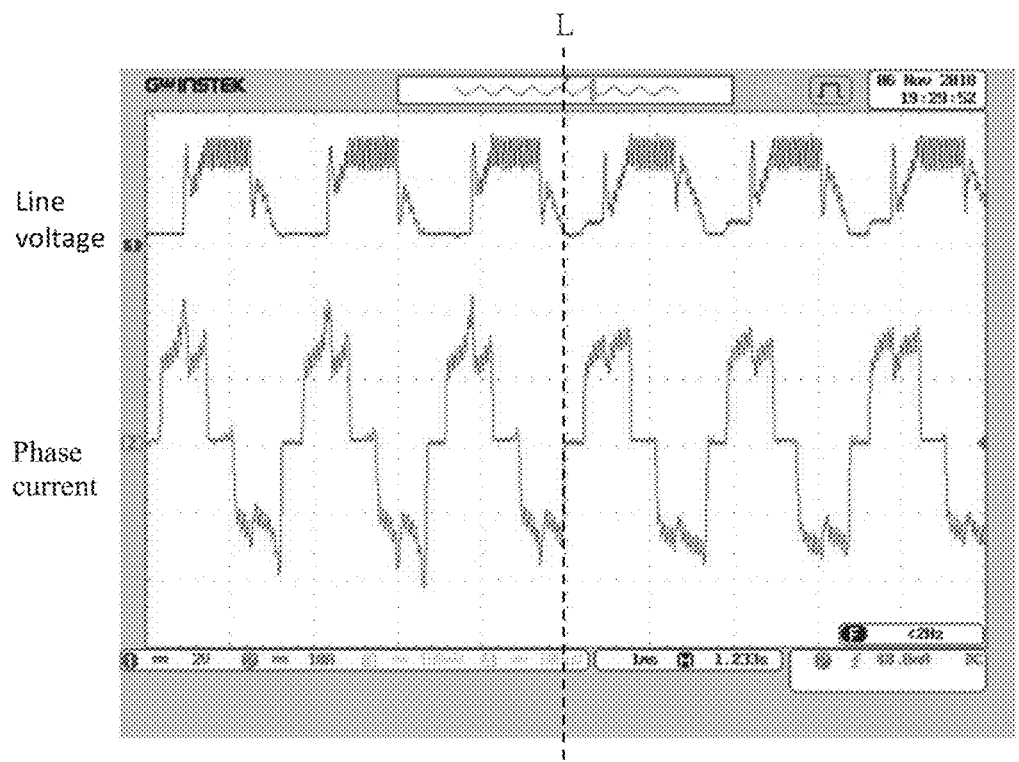
FIG. 6 is an oscillogram of the line voltage and the phase current, showing the waveform difference before and after the compensated offset voltage.
Figure 7:
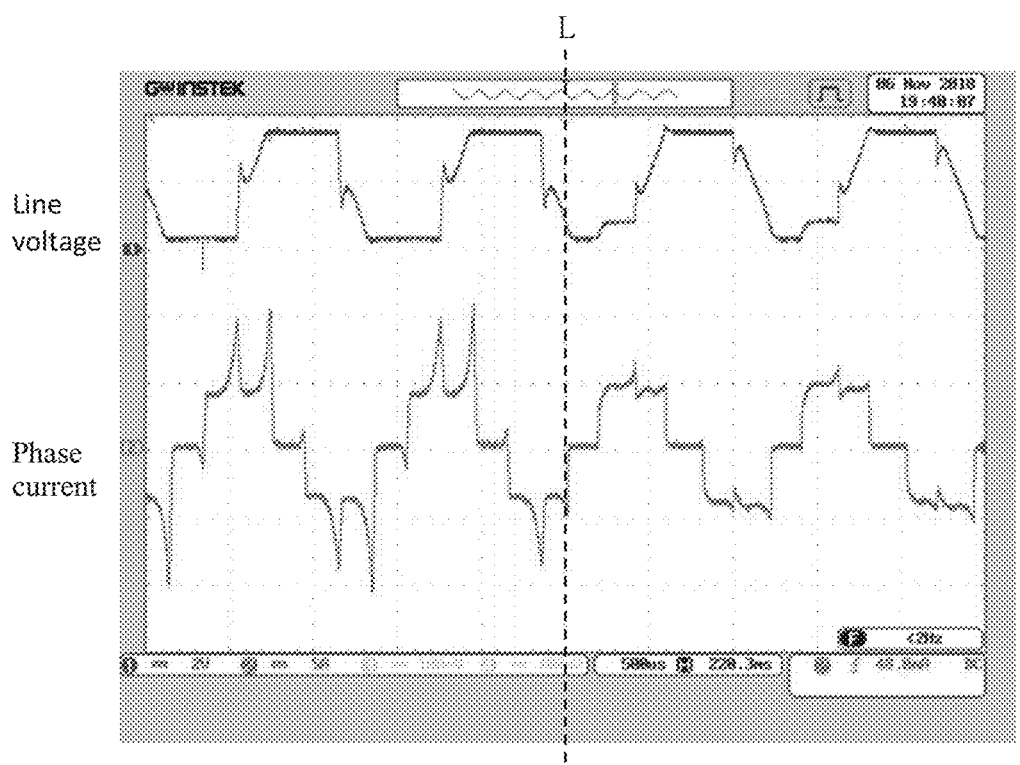
FIG. 7 is an oscillogram of the line voltage and the phase current, showing the waveform difference before and after the compensated offset voltage.

With the aforementioned design, by detecting the counter EMF signal of each of the phase coils and supplying the offset voltage to the node of the corresponding voltage divider at an appropriate timing, the phase lagging problem and the phase delaying problem could be effectively compensated, providing a performance of compulsory early commutation, achieving the early commutation control. FIG. 5 to FIG. 7 are oscillograms of a line voltage and a phase current on different time bases, wherein on a left side of an imaginary line L is the line voltage waveform and the phase current waveform before compensating the offset voltage, while on the right side of the imaginary line L is the line voltage waveform and the phase current waveform after compensating the offset voltage. It can be seen from the figures that after compensating the offset voltage, the waveform of the line voltage significantly becomes average and symmetrical, and the surge of the phase current is also effectively reduced.

Figure 8:
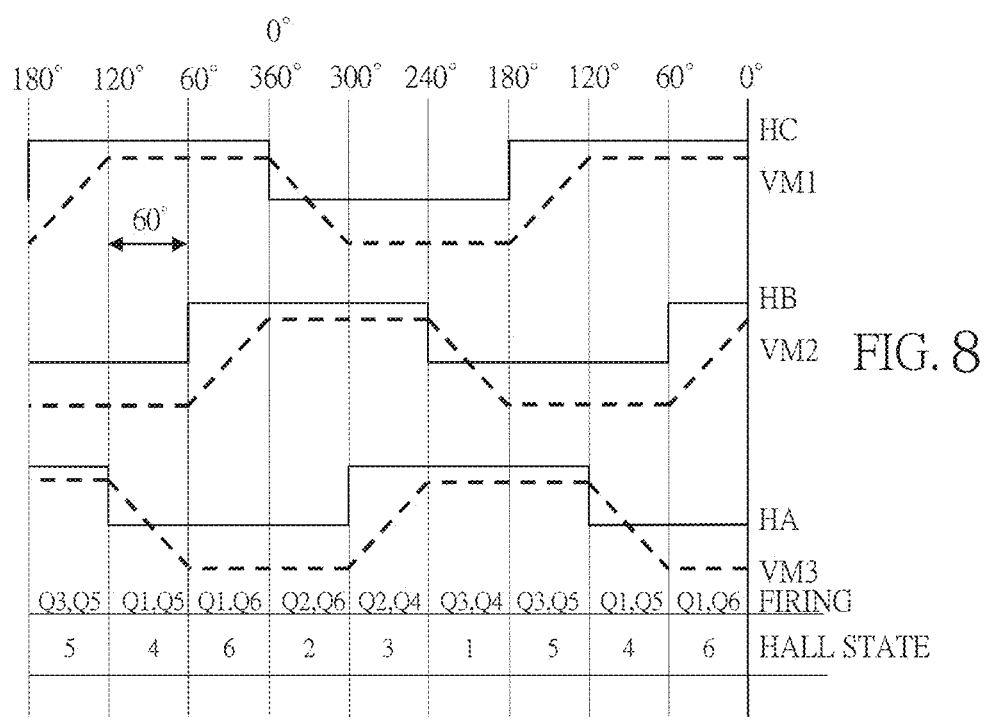
FIG. 8 is a timing schematic diagram of the counter EMF signals and the logic signals.
Figure 9:
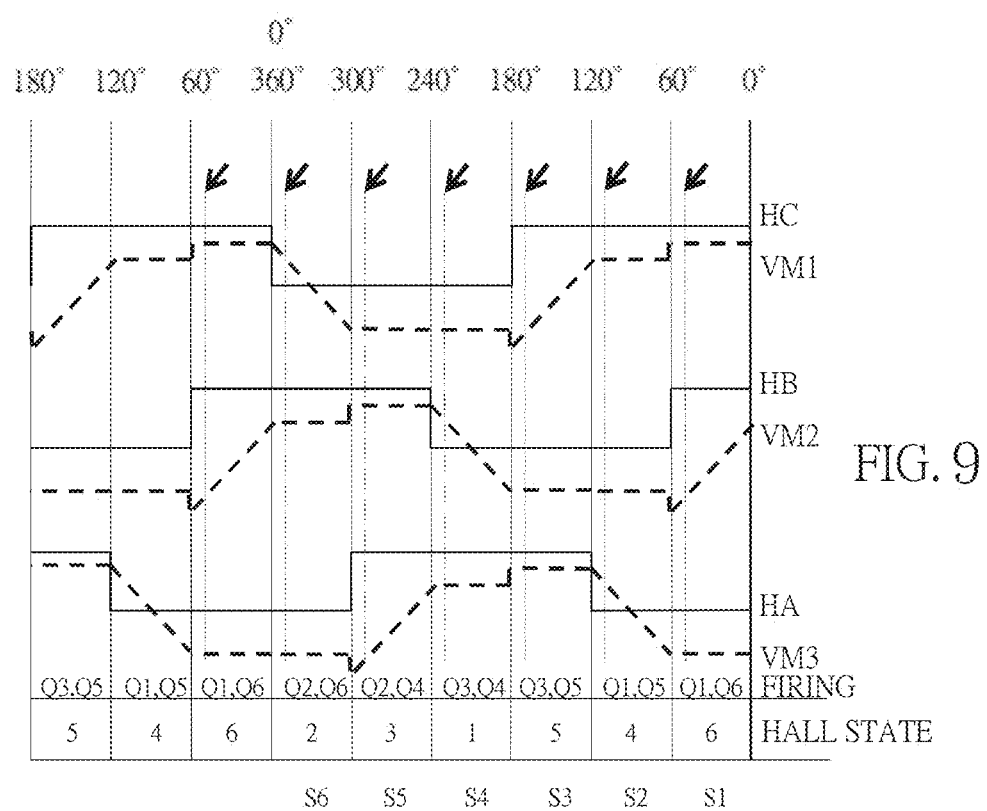
FIG. 9 is a timing schematic diagram of the counter EMF signals and the logic signals, showing the control circuit could determine to supply the offset voltage to which nodes by providing a negative offset voltage to the node of the voltage divider which corresponds to the phase coil of the previous phase sequence when detecting the counter EMF signal of one of the phase coils starts rising.

In addition, in an embodiment, the control circuit 22 could determine to supply the offset voltage to which nodes N1, N2, N3 by providing a negative offset voltage to the node of the voltage divider 12 which corresponds to the phase coil of the previous phase sequence when detecting the counter EMF signal of one of the phase coils starts rising. For instance, referring to FIG. 8 and FIG. 9, in the interval of 60 degrees to 180 degrees, after completing the control of the logic signals of the previous phase sequence (i.e., the interval of 0 degree to 60 degrees), or when the detected counter EMF signal VM3 starts rising or rises to the predetermined threshold value, the control circuit 22 timely controls the corresponding voltage source V1 to output a negative offset voltage to the corresponding node N1 of the voltage divider 12 which corresponds to the phase coil U of the previous phase sequence, so that a level of the counter EMF signal VM1 of the node N1 descends. In this way, in the interval of 60 degrees to 120 degrees, when the comparator U1A compares the counter EMF signal VM3 of the node N3 and the counter EMF signal VM1 of the node N1, the logic signal HA could be converted in advance to achieve the early commutation effect. In addition, in the interval of 120 degrees to 180 degrees, when the comparator U1B compares the counter EMF signal VM1 of the node N1 and the counter EMF signal VM2 of the node N2, the logic signal HC could be converted in advance to achieve the early commutation effect.

Moreover, in the interval of 180 degrees to 300 degrees, after completing the control of the logic signals of the previous phase sequence (i.e., the interval of 120 degrees to 180 degrees), or when the detected counter EMF signal VM2 starts rising or rises to the predetermined threshold value, the control circuit 22 timely controls the corresponding voltage source V3 to output a negative offset voltage to the corresponding node N3 of the voltage divider 12 which corresponds to the phase coil V of the previous phase sequence, so that a level of the counter EMF signal VM3 of the node N3 descends. In this way, in the interval of 180 degrees to 240 degrees, when the comparator U1C compares the counter EMF signal VM2 of the node N2 and the counter EMF signal VM3 of the node N3, the logic signal HB could be converted in advance to achieve the early commutation effect. Also, in the interval of 240 degrees to 300 degrees, when the comparator U1A compares the counter EMF signal VM3 of the node N3 and the counter EMF signal VM1 of the node N1, the logic signal HA could be converted in advance to achieve the early commutation effect.

Furthermore, in the interval of 300 degrees to 60 degrees, after completing the control of the logic signals of the previous phase sequence (i.e., the interval of 240 degrees to 300 degrees), or when the detected counter EMF signal VM1 starts rising or rises to the predetermined threshold value, the control circuit 22 timely controls the corresponding voltage source V2 to output a negative offset voltage to the corresponding node N2 of the voltage divider 12 which corresponds to the phase coil W of the previous phase sequence, so that a level of the counter EMF signal VM2 of the node N2 descends. In this way, in the interval of 300 degrees to 360 degrees, when the comparator U1B compares the counter EMF signal VM1 of the node N1 and the counter EMF signal VM2 of the node N2, the logic signal HC could be converted in advance to achieve the early commutation effect. Also, in the interval of 360 degrees to 60 degrees, when the comparator U1C compares the counter EMF signal VM2 of the node N2 and the counter EMF signal VM3 of the node N3, the logic signal HB could be converted in advance to achieve the early commutation effect.

In this way, the phase of the logic signals HC, HB, HA could advance, and the phase lagging problem and the phase delaying problem could be effectively compensated, providing a performance of compulsory early commutation, achieving the early commutation control.

Figure 10:
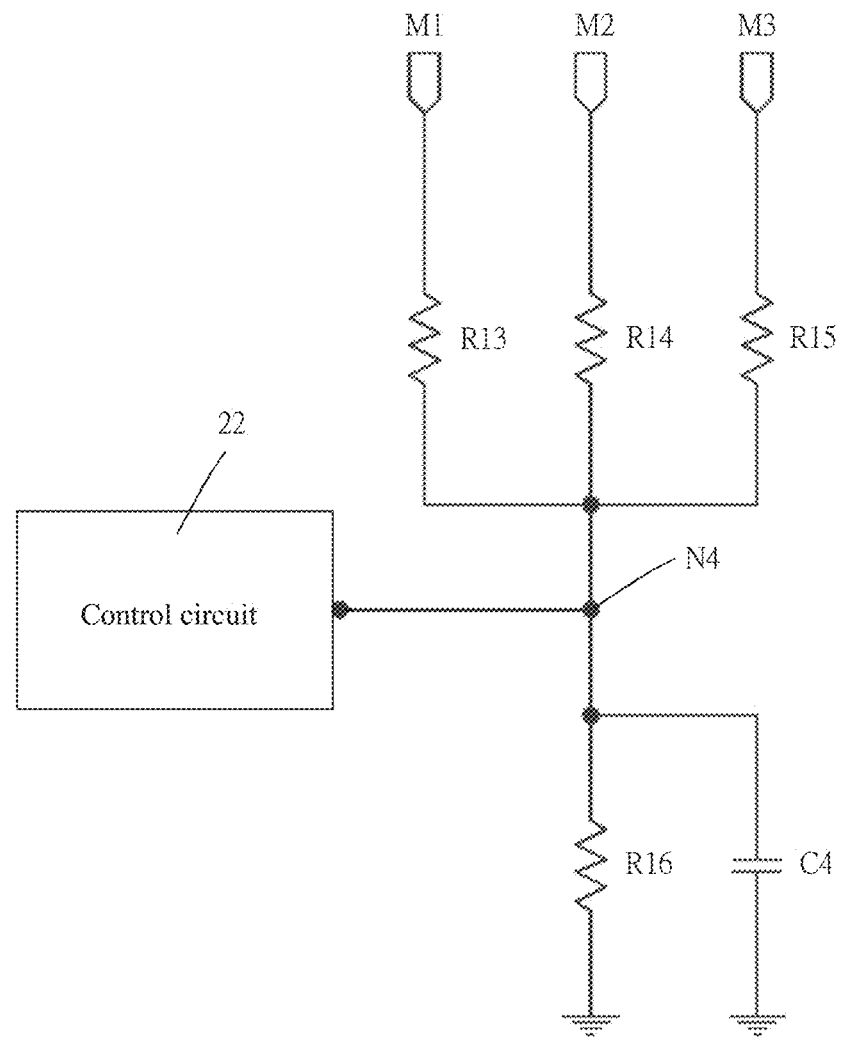
FIG. 10 is a circuit schematic diagram, showing neutral point average voltage is used to provide the compensation reference potential to the control circuit.

In addition, as shown in FIG. 10, in an embodiment, the controller further includes a compensation potential adjusting circuit, wherein the compensation potential adjusting circuit includes three resistors R13, R14, R15 which are connected in parallel. An end of each of the resistors R13, R14, R15 is respectively connected to one of the terminal voltages M1, M2, M3 of the three-phase coils U, V, W, while another end thereof is connected to a neutral point. For instance, the another end of each of the resistors R13, R14, R15 is connected to a virtual neutral point N4, or is directly connected to an actual neutral point N. The control circuit 22 is connected to the virtual neutral point N4 or the actual neutral point N, and adjusts a magnitude of the outputted offset voltage based on an average voltage value of the virtual neutral point N4 (or the actual neutral point N). In this way, the offset voltage to be compensated could be adaptively adjusted according to a variation of the rotational speed or a variation of the load, thereby to provide a better phase leading compensation or a better phase lagging compensation.

Moreover, in an embodiment, the control circuit 22 could determine to supply the offset voltage to which nodes N1, N2, N3 by detecting the counter EMF signal on the terminal voltage M1, M2, M3. Furthermore, in an embodiment, the voltage source could be provided by the controller, alternatively, the controller controls a voltage source or a plurality of voltage sources to output electricity. It must be pointed out that the embodiments described above are only some embodiments of the present invention. All equivalent structures and methods which employ the concepts disclosed in this specification and the appended claims should fall within the scope of the present invention.

What is claimed is:

1. A controller for a DC brushless motor, wherein the controller is adapted to be connected to a commutation circuit; the commutation circuit includes three voltage dividers and three comparators; each of the voltage dividers includes a first resistor and a second resistor which are connected in series; an end of each of the first resistors is connected to a corresponding terminal voltage of three-phase coils of the DC brushless motor; each of the comparators includes a positive input end and a negative input end; the positive input end of each of the comparators is connected to a node connected to the first resistor and the second resistor of the corresponding voltage divider; the negative input end of each of the comparators is connected to the node of the adjacent voltage divider; the controller comprising:

three bias resistors, wherein each of the bias resistors has an input end and an output end; each of the input ends is connected to a voltage source; each of the output ends is connected to the node of one of the voltage dividers; and a control circuit electrically connected to the three-phase coils, wherein the control circuit is configured to detect a counter EMF signal of each of the three-phase coils and to supply an electric energy based on a detecting result, thereby to provide an offset voltage to the node of the corresponding voltage divider via the corresponding bias resistor.

2. The controller of claim 1, wherein the control circuit detects a control logical sequence of a phase sequence when the DC brushless motor is running so as to predict a next commutation point accordingly, and supplies the offset voltage to the node of the corresponding voltage divider when approaching the next commutation point.

3. The controller of claim 2, wherein the offset voltage is in a form of pulse, and is removed after a commutation is completed.

4. The controller of claim 1, wherein the control circuit outputs the offset voltage via each of the bias resistors based on a predetermined sequence.

5. The controller of claim 1, wherein when the control circuit detects that the counter EMF signal of one of the three-phase coils starts descending, the control circuit provides a positive offset voltage to the node of the voltage divider which corresponds to the phase coil of a previous phase sequence.

6. The controller of claim 5, wherein the control circuit controls a value of the supplied offset voltage according to a downward inclination, a voltage value, or a current value of the counter EMF signal detected by the control circuit.

7. The controller of claim 1, wherein when the control circuit detects that the counter EMF signal of one of the three-phase coils starts rising, the control circuit provides a negative offset voltage to the node of the voltage divider which corresponds to the phase coil of a previous phase sequence.

8. The controller of claim 7, wherein the control circuit controls a value of the supplied offset voltage according to a rising inclination, a voltage value, or a current value of the counter EMF signal detected by the control circuit.

9. The controller of claim 1, wherein the control circuit determines a commutation sequence of the three-phase coils according to the counter EMF signal of each of the three-phase coils; when detecting the counter EMF signal of one of the three-phase coil rises to a predetermined threshold value, the control circuit provides a positive offset voltage to the node of the voltage divider which corresponds to the phase coil of a next phase sequence.

10. The controller of claim 1, wherein the control circuit determines a commutation sequence of the three-phase coils according to the counter EMF signal of each of the three-phase coils; when detecting the counter EMF signal of one of the three-phase coil rises to a predetermined threshold value, the control circuit provides a negative offset voltage to the node of the voltage divider which corresponds to the phase coil of a previous phase sequence.

11. The controller of claim 1, further comprising a compensation potential adjusting circuit, wherein the compensation potential adjusting circuit comprises three resistors which are connected in parallel; an end of each of the resistors is connected to one of the terminal voltages of the three-phase coils, while another end of each of the resistors is connected to a neutral point; the control circuit is electrically connected to the neutral point, and adjusts a magnitude of the outputted offset voltage based on an average voltage value of the neutral point.

12. A control method for a DC brushless motor, wherein the DC brushless motor is connected to a commutation circuit; the commutation circuit includes three voltage dividers and three comparators; each of the voltage dividers includes a first resistor and a second resistor which are connected in series; an end of each of the first resistors is connected to a corresponding terminal voltage of three-phase coils of the DC brushless motor; each of the comparators includes a positive input end and a negative input end; the positive input end of each of the comparators is connected to a node connected to the first resistor and the second resistor of the corresponding voltage divider; the negative input end of each of the comparators is connected to the node of the adjacent voltage divider; the control method comprising steps of:

supplying electricity to the DC brushless motor to drive the DC brushless motor to operate; and detecting a counter EMF signal of each of the three-phase coils, and providing an offset voltage to the node of the corresponding voltage divider based on a detecting result.

13. The method of claim 12, wherein a commutation sequence of the three-phase coils is determined according to the counter EMF signal of each of the three-phase coils; when detecting the counter EMF signal of one of the three-phase coil rises to a predetermined threshold value, providing a positive offset voltage to the node of the voltage divider which corresponds to the phase coil of a next phase sequence.

14. The method of claim 12, wherein a commutation sequence of the three-phase coils is determined according to the counter EMF signal of each of the three-phase coils; when detecting the counter EMF signal of one of the three-phase coil rises to a predetermined threshold value, providing a negative offset voltage to the node of the voltage divider which corresponds to the phase coil of a previous phase sequence.

15. The method of claim 12, further comprising the following steps: predicting a next commutation point according to a control logical sequence of a phase sequence when the DC brushless motor is running, and supplying the offset voltage to the node of the corresponding voltage divider when approaching the next commutation point.

16. The method of claim 15, wherein the offset voltage is in a form of pulse, and is removed after a commutation is completed.

* * * * *